(12) United States Patent
Zhang et al.

(10) Patent No.: US 9,444,436 B2
(45) Date of Patent: Sep. 13, 2016

(54) FULLY DIFFERENTIAL LEVEL CONVERSION CIRCUIT

(71) Applicant: IPGoal Microelectronics (Sichuan) Co., Ltd., Chengdu (CN)

(72) Inventors: Ziche Zhang, Chengdu (CN); Zhengxian Zou, Chengdu (CN)

(73) Assignee: IPGLOBAL MICROELECTRONICS (SICHUAN) CO., LTD., Chengdu (CN)

( * ) Notice: Subject to any disclaimer, the term of this patent is extended or adjusted under 35 U.S.C. 154(b) by 127 days.

(21) Appl. No.: 14/486,274

(22) Filed: Sep. 15, 2014

(65) Prior Publication Data

US 2015/0200658 A1 Jul. 16, 2015

(30) Foreign Application Priority Data

Jan. 16, 2014 (CN) .......................... 2014 1 0019164

(51) Int. Cl.
*H03L 5/00* (2006.01)
*H03K 3/356* (2006.01)

(52) U.S. Cl.
CPC ..... *H03K 3/356113* (2013.01); *H03K 3/35613* (2013.01)

(58) Field of Classification Search
CPC ........................................................ H03L 5/00
See application file for complete search history.

(56) References Cited

U.S. PATENT DOCUMENTS

2009/0108885 A1* 4/2009 Natonio ............. H03K 3/35625
327/115

* cited by examiner

*Primary Examiner* — Hai L Nguyen
(74) *Attorney, Agent, or Firm* — Shimokaji IP

(57) ABSTRACT

A fully differential level conversion circuit includes a positive signal branch, a negative signal branch and a coupling branch. The negative signal branch has identical structural features with the positive signal branch, which includes a drive terminal and a load terminal, an external fully differential signal is inputted to the drive terminals of the positive signal branch and the negative signal branch correspondingly. The coupling branch includes a first group of active couplers which forms a dual structure with the drive terminal of the positive signal branch and a second group of active couplers which form another dual structure with the drive terminal of the negative signal branch, both of which are connected between the drive terminals and load terminals. The fully differential level conversion circuit realizes applications in the signal processing process which has low power consumption and high-speed, and improves duty cycle of the output signal.

5 Claims, 4 Drawing Sheets

US 9,444,436 B2

FULLY DIFFERENTIAL LEVEL CONVERSION CIRCUIT

RELATED APPLICATIONS

This application claims the benefit of priority to Chinese Patent Application No. 201410019164.9, filed on Jan. 16, 2014, which is hereby incorporated by reference in its entirety.

FIELD OF THE INVENTION

The present invention relates to a technical field of integrated circuits, more specifically to a fully differential level conversion circuit.

BACKGROUND OF THE INVENTION

In some high-speed applications, it's necessary to reduce level swing of CMOS (complementary metal oxide semiconductor) with high-speed signals to get better working characteristics. As an example, in the high-speed charge pump switch control circuit, if the control signal is in a low swing, then the charge pump switch is kept working in a saturation region, thereby obtaining a constant charge and discharge current, decreasing the setup time of signal edge, and reducing the charge feed-through of the switch tube. As another example, in the high-speed or ultra-high-speed differential data signal processing circuit, a low swing signal can reduce power consumption, reduce setup time of the signal edge, and increase linear range of the input. Therefore, various level conversion circuits are widely used in a variety of high-speed applications.

The structure of existing fully differential level conversion circuit is showed in FIG. 1. As shown in FIG. 1, the existing fully differential level conversion circuit includes a positive signal branch and a negative signal branch, the positive signal branch and the negative signal branch have identical structural features, both of which include a drive terminal and a load terminal. When operates, an external fully differential signal will be inputted to the drive terminals of the positive signal branch and the negative signal branch respectively. Concretely, a fully differential signal INP is inputted to the drive terminal of the positive signal branch, which will be converted by the positive signal branch to output a fully differential signal OUTN from the load terminal of the positive signal branch finally. Similarly, a fully differential signal INN is inputted to the drive terminal of the negative signal branch, which will be converted by the negative signal branch to output a fully differential signal OUTP from the load terminal of the negative signal branch finally. Specifically, the drive terminal of the positive signal branch consists of Field Effect Transistors M11 and M12, and its load terminal consists of Field Effect Transistors M13 and M14; while the drive terminal of the negative signal branch consists of Field Effect Transistors M15 and M16, and its load terminal consists of Field Effect Transistors M17 and M18, Specific connections of each Field Effect Transistor are showed in FIG. 1, which are not described in detail. Furthermore, the working process of the fully differential level conversion circuit is that, for the positive signal branch, if the fully differential signal INP inputted is a low level, then the Field Effect Transistor M11 is turned on, the Field Effect Transistor M12 is turned off, the Field Effect Transistor M13 is turned off, and the Field Effect Transistor M14 is turned on, that is only the Field Effect Transistor M14 which is an N-type Field Effect Transistor connected in a diode works as a load, thereby making the Field Effect Transistor M11 not to work as the same as a standard CMOS inverter to drag the output signal OUTN up to the supply voltage VDD, but to divide the voltage on the Field Effect Transistor M11 through the Field Effect Transistor M14 to obtain a high swing level which is not the supply voltage VDD. Otherwise, if the fully differential signal INP inputted is a high level, then the Field Effect Transistor M11 is turned off, the Field Effect Transistor M12 is turned on, the Field Effect Transistor M13 is turned on, and the Field Effect Transistor M14 is turned off, that is only the Field Effect Transistor M13 which is a P-type Field Effect Transistor connected in a diode works as the load, thereby making the Field Effect Transistor M12 not to work as the same as a standard CMOS inverter to drag the output signal OUTN down to the ground, but to divide the voltage on the Field Effect Transistor M12 through the Field Effect Transistor M13 to obtain a low swing level which is not the ground. Finally, the output signal OUTN gets a middle level which is higher than the ground and lower than the supply voltage. Similarly, analysis for the negative signal branch is the same as that for the positive signal branch, and the input and output waveforms are showed in FIG. 2.

While, since the Field Effect Transistors M11, M12, M15 and M16 in the above fully differential level conversion circuit are mismatched due to their process corner changes, the charge and discharge current of the output load point OUTN/OUTP made by the circuit is inconsistent, therefore slopes of rising edge and falling edge of the output signal are different (as the waveforms showed in FIG. 2), thereby resulting in a duty cycle deterioration for the output signal.

Therefore, it is necessary to provide an improved fully differential level conversion circuit to overcome the above drawbacks.

SUMMARY OF THE INVENTION

An objective of the present invention is to provide a fully differential level conversion circuit which has simple circuit structure, is applicable to application situation with low power consumption and high speed, and greatly improve the duty cycle of the output signal.

To achieve the objective, a fully differential level conversion circuit includes a positive signal branch, a negative signal branch and a coupling branch. The negative signal branch has identical structural features with the positive signal branch, and both the positive signal branch and the negative signal branch includes a drive terminal and a load terminal, an external fully differential signal is inputted to the drive terminals of the positive signal branch and the negative signal branch correspondingly to proceed a level conversion so that their load terminals output a pseudo differential signal; and the coupling branch includes a first group of active couplers and a second group of active couplers, both of the first group of active couplers and the second group of active couplers are connected between the positive signal branch and the negative signal branch, and further between the drive terminals and the load terminals, the first group of active couplers and the drive terminal of the positive signal branch form a dual structure, the second group of active couplers and the drive terminal of the negative signal branch forms another dual structure.

Preferably, the drive terminal of the positive signal branch comprises a first Field Effect Transistor which is a P-type Field Effect Transistor and a second Field Effect Transistor which is an N-type Field Effect Transistor, gates of the first Field Effect Transistor and the second Field Effect Transistor are jointly connected to an output terminal of the external fully differential signal, drains of the first Field Effect Transistor and the second Field Effect Transistor are jointly connected to an output terminal of the positive signal branch, a source of the first Field Effect Transistor is connected with an external power source, and a source of the second Field Effect Transistor is grounded.

Preferably, the first group of active couplers comprises a third Field Effect Transistor which is an N-type Field Effect Transistor and a fourth Field Effect Transistor which is a P-type Field Effect Transistor, drains of the third Field Effect Transistor and the fourth Field Effect Transistor are connected with the drain of the first Field Effect Transistor, gates of the third Field Effect Transistor and the fourth Field Effect Transistor are connected with the drain of the first Field Effect Transistor, a source of the third Field Effect Transistor is grounded, and a source of the fourth Field Effect Transistor is connected with the external power source; and the second group of active couplers comprises a fifth Field Effect Transistor which is an N-type Field Effect Transistor and a sixth Field Effect Transistor which is a P-type Field Effect Transistor, drains of the fifth Field Effect Transistor and the sixth Field Effect Transistor are connected with the drain of the first Field Effect Transistor, gates of the fifth Field Effect Transistor and the sixth Field Effect Transistor are connected with the drain of the first Field Effect Transistor, a source of the fifth Field Effect Transistor is grounded, and a source of the sixth Field Effect Transistor is connected with the external power source.

Preferably, the load terminal comprises a seventh Field Effect Transistor which is a P-type Field Effect Transistor and an eighth Field Effect Transistor which is an N-type Field Effect Transistor, gates and drains of the seventh Field Effect Transistor and the eighth Field Effect Transistor are jointly connected to the drain of the first Field Effect Transistor, a source of the seventh Field Effect Transistor is connected with the external power source, a source of the eighth Field Effect Transistor is grounded, and the pseudo differential signal is outputted from the drains of the seventh Field Effect Transistor and the eighth Field Effect Transistor commonly.

Preferably, the load terminal is a seventh Field Effect Transistor which is a P-type Field Effect Transistor, gate and drain of the seventh Field Effect Transistor are jointly connected to the drain of the first Field Effect Transistor, a source of the seventh Field Effect Transistor is connected with the external power source, and the pseudo differential signal is outputted from the drain of the seventh Field Effect Transistor.

Preferably, the load terminal is an eighth Field Effect Transistor which is an N-type Field Effect Transistor, gate and drain of the eighth Field Effect Transistor are jointly connected to the drain of the first Field Effect Transistor, a source of the eighth Field Effect Transistor is grounded, and the pseudo differential signal is outputted from the drain of the eighth Field Effect Transistor.

In comparison with the prior art, since the fully differential level conversion circuit of the present invention further includes a coupling branch, and the coupling branch includes a first group of active couplers and a second group of active couplers, and both of the first group of active couplers and the second group of active couplers are connected between the positive signal branch and the negative signal branch, and further between the drive terminals and the load terminals, the first group of active couplers and the drive terminal of the positive signal branch form a dual structure, and the second group of active couplers and the drive terminal of the negative signal branch form another dual structure; thus during the level conversion process, the first group of active couplers and the second group of active couplers can counteract the process corner changes of the drive terminals of the positive signal branch and the negative signal branch, thereby improving the duty cycle of the output signal, and realizing applications of the fully differential level conversion circuit according to the present invention in the signal processing process which has low power consumption and high speed.

The present invention will become more apparent from the following detailed description when taken in conjunction with the accompanying drawings used to illustrate embodiments of the invention.

DETAILED DESCRIPTION OF ILLUSTRATED EMBODIMENTS

Figure 1:
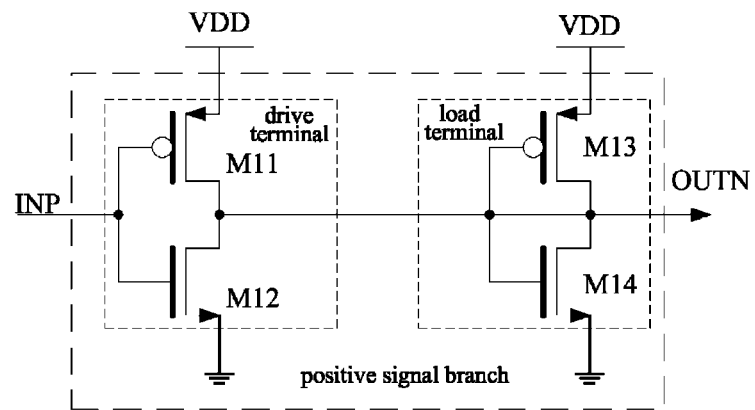
FIG. 1 is a circuit diagram of the existing fully differential level conversion circuit.
Figure 1:
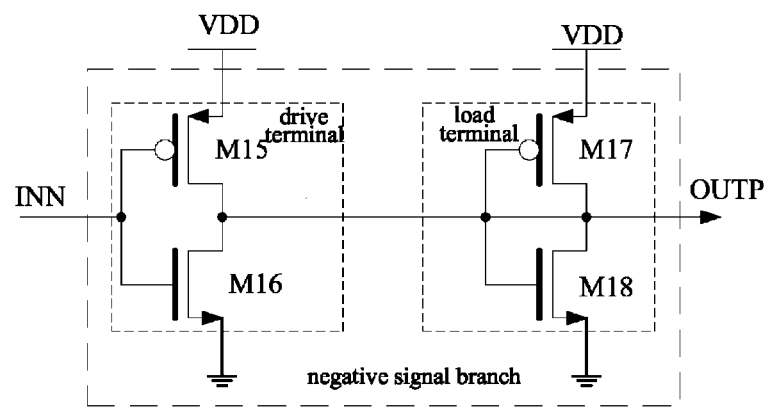
Figure 2:
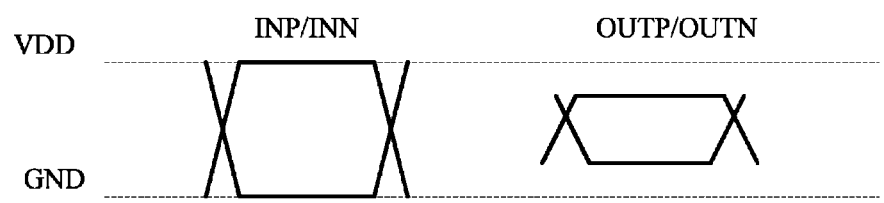
FIG. 2 is an oscillogram of the circuit showed in FIG. 1.

Preferred embodiments of the present invention will be described taking in conjunction with the accompanying drawings below, and a similar component label in the drawings refers to a similar component. As noted above, the present invention provides a fully differential level conversion circuit which has simple circuit structure, is applicable to application situation with low power consumption and high speed, and greatly improves the duty cycle of the output signal.

Figure 3:
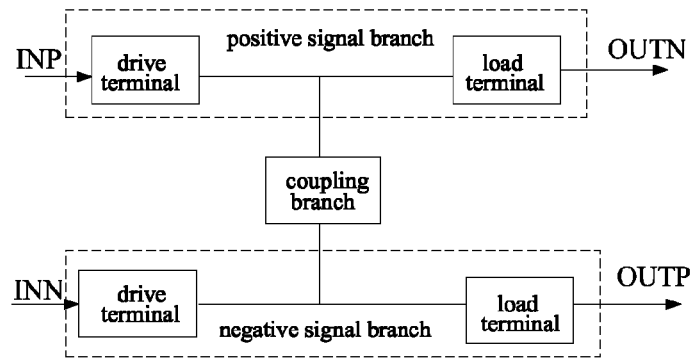
FIG. 3 is a frame diagram of the fully differential level conversion circuit according to the present invention.

Please refer to FIG. 3, FIG. 3 is a frame diagram of the fully differential level conversion circuit according to the present invention. As shown in FIG. 3, the fully differential level conversion circuit of the present invention includes a positive signal branch, a coupling branch and a negative signal branch, therein the positive signal branch and the negative signal branch have identical structural features. Concretely, both the positive signal branch and the negative signal branch include a drive terminal and a load terminal respectively. When operates, an external fully differential signal will be inputted to the drive terminals of the positive signal branch and the negative signal branch correspondingly. More specifically, an external fully differential signal INP is inputted to the drive terminal of the positive signal branch, which will be converted by the positive signal branch to output a pseudo differential signal OUTN from the load terminal of the positive signal branch finally; and an external fully differential signal INN is inputted to the drive terminal of the negative signal branch, which will be converted by the negative signal branch to output a pseudo differential signal OUTP from the load terminal of the negative signal branch finally. Besides, the coupling branch is connected between the positive signal branch and the negative signal branch, and further between the drive terminals and the load terminals, moreover, the coupling branch forms dual structures with the drive terminals of the positive signal branch and the negative signal branch respectively, thereby counteracting the process corner changes of the drive terminals of the positive signal branch and the negative signal branch, and improving the duty cycle of the output signal.

Figure 4:
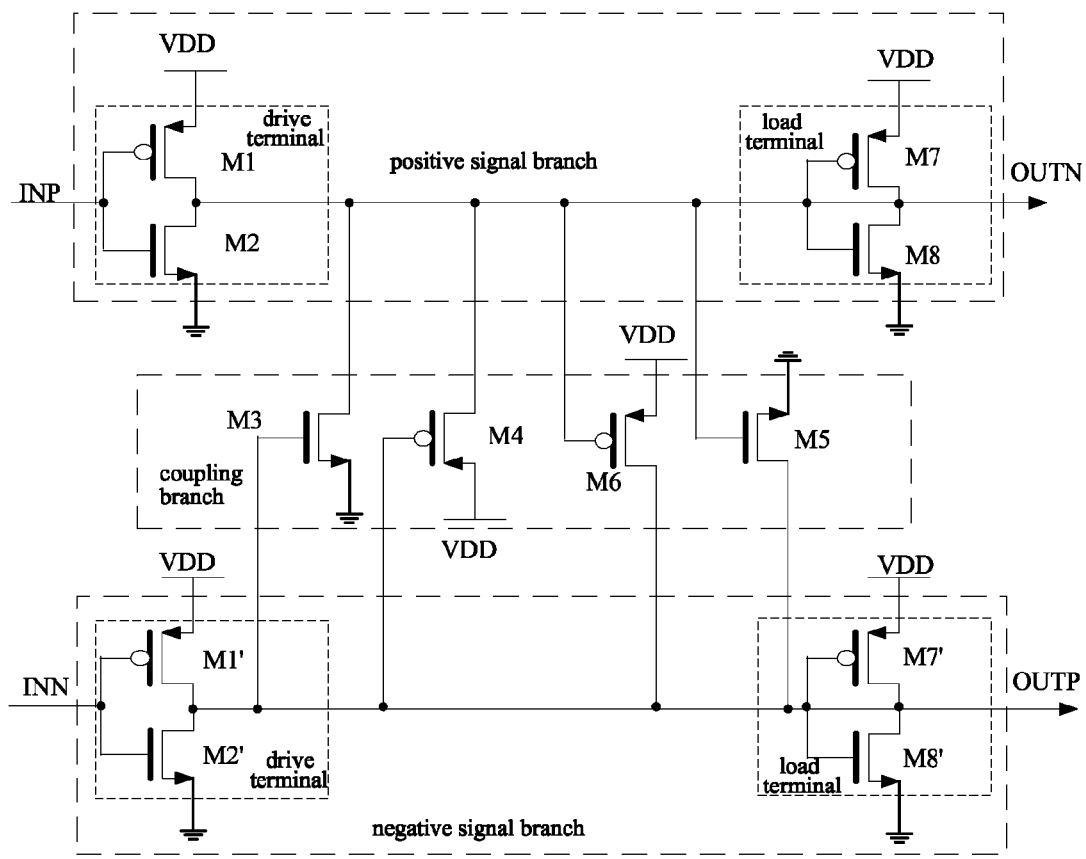
FIG. 4 is a circuit diagram of the fully differential level conversion circuit according to the first embodiment of the present invention.
Figure 5:
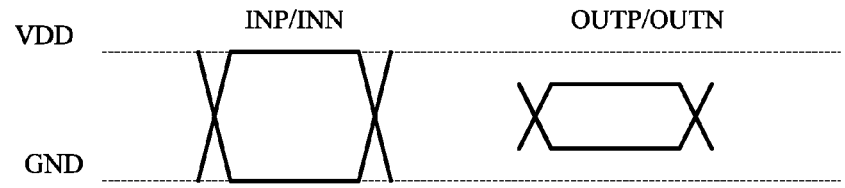
FIG. 5 is an oscillogram of the circuit showed in FIG. 4.

Specifically, please refer to FIG. 4 and FIG. 5 to describe the first embodiment of the present invention. As shown in figures, the drive terminal of the positive signal branch includes a first Field Effect Transistor M1 which is a P-type Field Effect Transistor and a second Field Effect Transistor M2 which is an N-type Field Effect Transistor; gates of the first Field Effect Transistor M1 and the second Field Effect Transistor M2 are jointly connected to an output terminal of the external fully differential signal which outputs a fully differential signal INP to the drive terminal of the positive signal branch; drains of the first Field Effect Transistor M1 and the second Field Effect Transistor M2 are jointly connected to an output terminal of the positive signal branch which outputs an output signal OUTN converted by the positive signal branch; besides, a source of the first Field Effect Transistor M1 is connected with an external power source VDD, a source of the second Field Effect Transistor M2 is grounded. And the structural features of the positive signal branch are the same as that of the negative signal branch, so the drive terminal of the negative signal branch includes a first Field Effect Transistor M1' and a second Field Effect Transistor M2', and another output terminal of the external fully differential signal outputs a fully differential signal INN to the drive terminal of the negative signal branch, and specific connections are showed in FIG. 4, which are not described in detail. Furthermore, the coupling branch includes a first group of active couplers and a second group of active couplers; both the first group of active couplers and the second group of active couplers are connected between the positive signal branch and the negative signal branch, and further between the drive terminals and the load terminals, the first group of active couplers and the drive terminal of the positive signal branch form a dual structure, and the second group of active couplers and the drive terminal of the negative signal branch form another dual structure at the same time. Concretely, the first group of active couplers includes a third Field Effect Transistor M3 which is an N-type Field Effect Transistor and a fourth Field Effect Transistor M4 which is a P-type Field Effect Transistor, drains of the third Field Effect Transistor M3 and the fourth Field Effect Transistor M4 are connected with the drain of the first Field Effect Transistor M1 in the positive signal branch, gates of the third Field Effect Transistor M3 and the fourth Field Effect Transistor M4 are connected with the drain of the first Field Effect Transistor M1' in the negative signal branch, a source of the third Field Effect Transistor M3 is grounded, and a source of the fourth Field Effect Transistor M4 is connected with the external power source VDD. From the above description, it can be seen that the first group of active couplers and the drive terminal of the positive signal branch form a dual structure. Similarly, the second group of active couplers includes a fifth Field Effect Transistor M5 which is an N-type Field Effect Transistor and a sixth Field Effect Transistor M6 which is a P-type Field Effect Transistor, drains of the fifth Field Effect Transistor M5 and the sixth Field Effect Transistor M6 are connected with the drain of the first Field Effect Transistor M1' in the negative signal branch, gates of the fifth Field Effect Transistor M5 and the sixth Field Effect Transistor M6 are connected with the drain of the first Field Effect Transistor M1 in the positive signal branch, a source of the fifth Field Effect Transistor M5 is grounded, and a source of the sixth Field Effect Transistor M6 is connected with the external power source VDD. From the above description, it can be seen that the second group of active couplers and the drive terminal of the negative signal branch form a dual structure at the same time. Moreover, the load terminal of the positive signal branch includes a seventh Field Effect Transistor M7 which is a P-type Field Effect Transistor and an eighth Field Effect Transistor M8 which is an N-type Field Effect Transistor, gates and drains of the seventh Field Effect Transistor M7 and the eighth Field Effect Transistor M8 are jointly connected to the drain of the first Field Effect Transistor M1, a source of the seventh Field Effect Transistor M7 is connected with the external power source VDD, a source of the eighth Field Effect Transistor M8 is grounded, and drains of the seventh Field Effect Transistor M7 and the eighth Field Effect Transistor M8 are the output terminal of the positive signal branch which outputs the pseudo differential signal OUTN converted. And the structural features of the positive signal branch are the same as that of the negative signal branch, so the load terminal of the negative signal branch includes a seventh Field Effect Transistor M7' and an eighth Field Effect Transistor M8', and the output terminal of the negative signal branch outputs the pseudo differential signal OUTP converted, and specific connections are showed in FIG. 4, which are not described in detail.

The working process of the first embodiment according to the present invention will be described following by combination with the FIG. 4 and FIG. 5. For the positive signal branch, if the fully differential signal INP inputted is a low level, then the first Field Effect Transistor M1 which is a P-type Field Effect Transistor is turned on, the second Field Effect Transistor M2 which is an N-type Field Effect Transistor is turned off, the seventh Field Effect Transistor M7 which is a P-type Field Effect Transistor is turned off, and the eighth Field Effect Transistor M8 which is an N-type Field Effect Transistor is turned on, so only the eighth Field Effect Transistor M8 which is an N-type Field Effect Transistor connected in a diode works as the load, thereby making the first Field Effect Transistor M1 not to work as the same as the standard CMOS inverter to drag the pseudo differential signal OUTN up to the power source VDD, and obtaining a high swing level (as shown in FIG. 5) which is not the power source VDD by dividing the voltage on the first Field Effect Transistor M1 through the eighth Field Effect Transistor M8. Otherwise, if the fully differential signal INP inputted is a high level, then the first Field Effect Transistor M1 which is a P-type Field Effect Transistor is turned off, the second Field Effect Transistor M2 which is an N-type Field Effect Transistor is turned on, the seventh Field Effect Transistor M7 which is a P-type Field Effect Transistor is turned on, and the eighth Field Effect Transistor M8 which is an N-type Field Effect Transistor is turned off, so only the seventh Field Effect Transistor M7 which is a P-type Field Effect Transistor connected in a diode works as the load, thereby making the second Field Effect Transistor M2 not to work as the same as the standard CMOS inverter to drag the pseudo differential signal OUTN down to the ground, and obtaining a low swing level (as shown in FIG. 5) which is not the ground by dividing the voltage on the second Field Effect Transistor M2 through the seventh Field Effect Transistor M7. Finally, the pseudo differential signal OUTN outputted gets a middle level which is higher than the ground and lower than the power source. Similarly, the conversion process to the external fully differential signal INN made by the negative signal branch is the same as that to the external fully differential signal INP made by the positive signal branch, and finally outputs a pseudo differential signal OUTP of which the input and output waveforms are showed in FIG. 5, which is not described in detail. During above level conversion process, since the first group of active couplers and the second group of active couplers are connected between the positive signal branch and the negative signal branch, thus the positive signal branch and the negative signal branch are coupled with each other, and the fully differential signals INN/INP inputted to the circuit are changed into correlated pseudo differential signals OUTN/OUTP via the two coupled branches, thereby improving the duty cycle distortion caused by the process corner changes. In addition, the third Field Effect Transistor M3 and the fourth Field Effect Transistor M4 of the first group of active couplers form dual structures with the first Field Effect Transistor M1 and the second Field Effect Transistor M2 of the drive terminal in the positive signal branch; similarly, the fifth Field Effect Transistor M5 and the sixth Field Effect Transistor M6 of the second group of active couplers form dual structures with the first Field Effect Transistor M1' and the second Field Effect Transistor M2' of the drive terminal in the negative signal branch at the same time. Moreover, the type of each Field Effect Transistor in the coupling branch is the same as that of the corresponding Field Effect Transistor in the drive terminals, however, the size of each Field Effect Transistor in the coupling branch is ½, ⅓ or ¼ of the size of the corresponding Field Effect Transistor in the drive terminals. Concretely, the process corner changes make the transconductance (gm) of each Field Effect Transistor in the drive terminals to itself be changed, and since connections of the Field Effect Transistors in the group of active couplers are coupled with the connections of the corresponding Field Effect Transistors in the drive terminals, namely the group of active couplers forms a latching mechanism which is similar to positive feedbacks with the Field Effect Transistors of the corresponding drive terminal, thereby keeping the original state of the signal not to change in some degree, and making the signal be free from excessively influences caused by gm changes, which means counteracting the process corner changes of the drive terminals' Field Effect Transistors, making slopes of the rising edge and the falling edge be the same and be free from mismatches caused by the gm changes, and keeping the crossovers of the differential signal to occur between the high swing and the low swing, thus improving the duty cycle of the pseudo differential signal.

Figure 6:
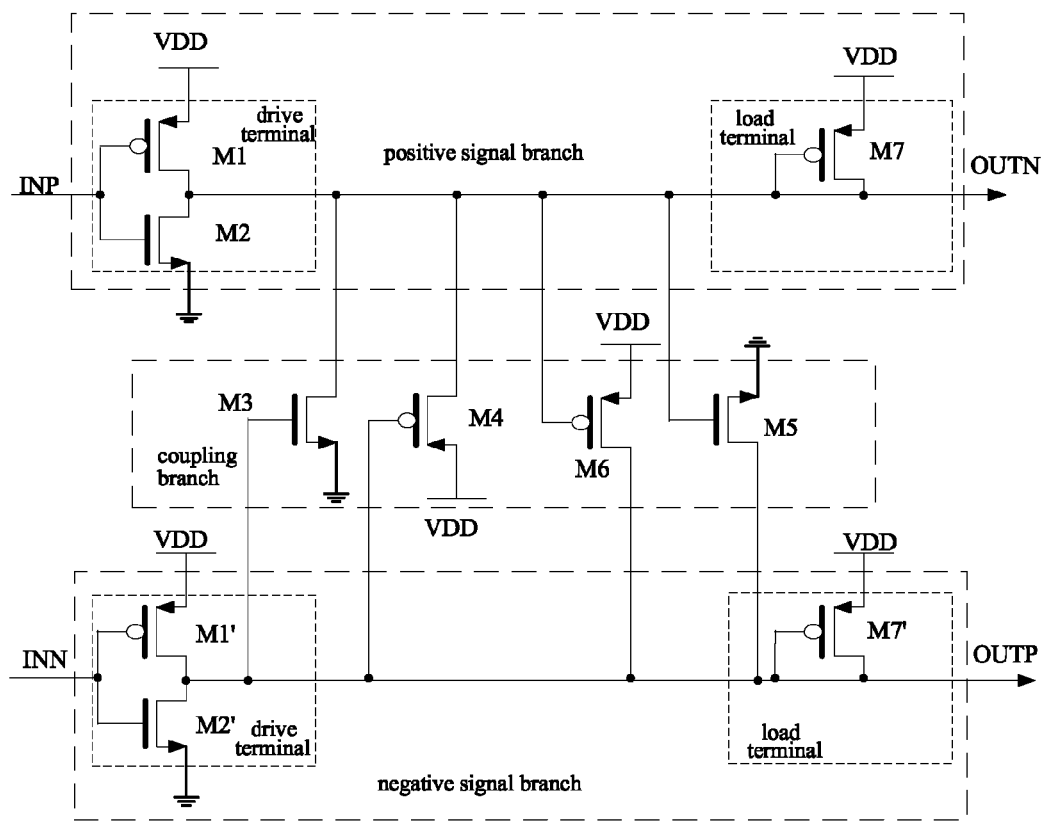
FIG. 6 is a circuit diagram of the fully differential level conversion circuit according to the second embodiment of the present invention.
Figure 7:
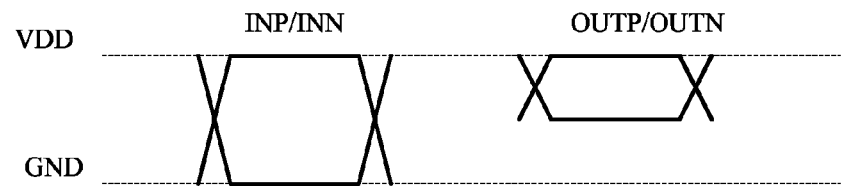
FIG. 7 is an oscillogram of the circuit showed in FIG. 6.

Please refer to FIG. 6 and FIG. 7 to describe the second embodiment of the present invention. As shown in figures, the difference between this embodiment and the first embodiment is, the load terminal of the positive signal branch only includes a seventh Field Effect Transistor M7, correspondingly, the load terminal of the negative signal branch only includes a seventh Field Effect Transistor M7'. All others are identical with the first embodiment, and in this embodiment, since the load terminal only includes the seventh Field Effect Transistor M7/M7', thus the upper boundary of the output signal OUTN/OUTP is the power source VDD, and its lower boundary is the middle level converted, and the waveforms of the output signal OUTN/OUTP are showed in FIG. 7. Specific conversion process and principles are the same as that of the first embodiment, which are not described in detail.

Figure 8:
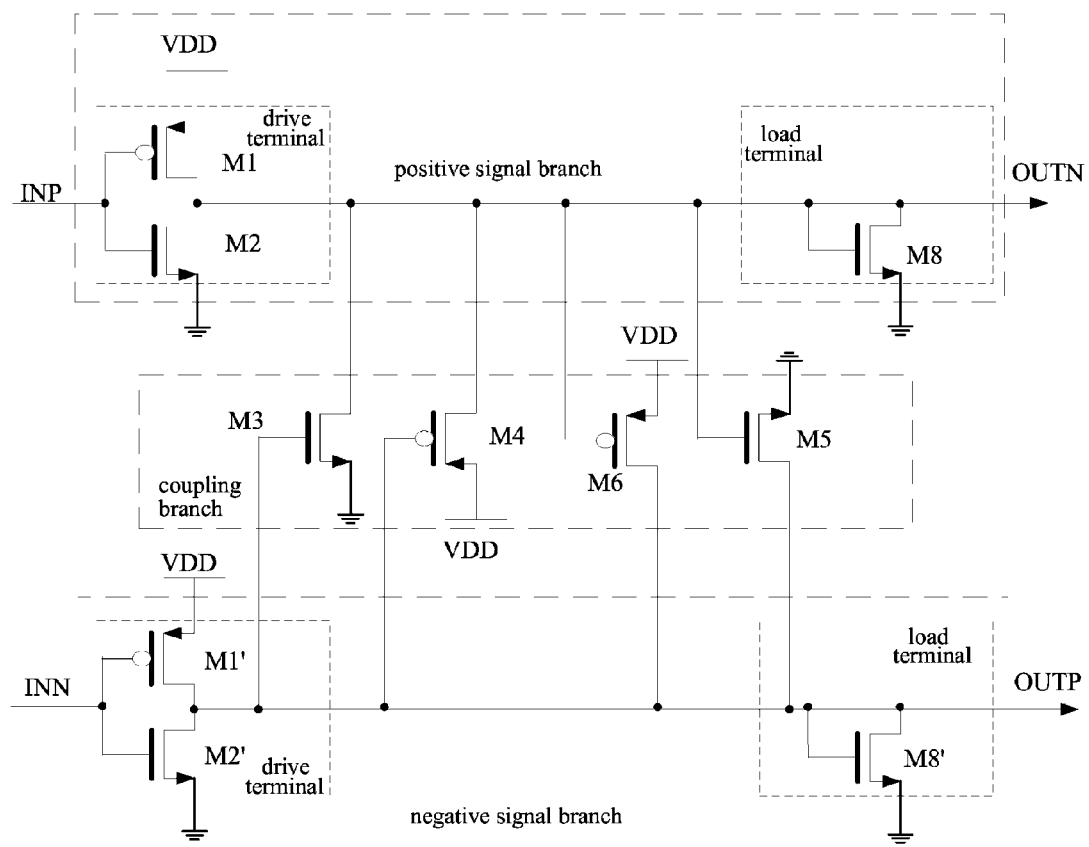
FIG. 8 is a circuit diagram of the fully differential level conversion circuit according to the third embodiment of the present invention.
Figure 9:
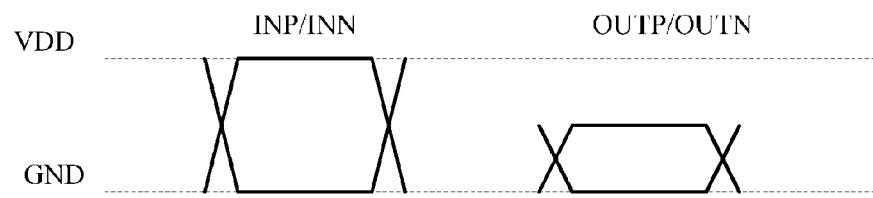
FIG. 9 is an oscillogram of the circuit showed in FIG. 8.

Please refer to FIG. 8 and FIG. 9 to describe the third embodiment of the present invention. As shown in figures, the difference between this embodiment and the first embodiment is, the load terminal of the positive signal branch only includes an eighth Field Effect Transistor M8, correspondingly, the load terminal of the negative signal branch only includes an eighth Field Effect Transistor M8'. All others are identical with the first embodiment, and in this embodiment, since the load terminal only includes the eighth Field Effect Transistor M8/M8', thus the lower boundary of the output signal OUTN/OUTP is '0', the upper boundary is the middle level converted, and the waveforms of the output signal OUTN/OUTP are showed in FIG. 9. Specific conversion process and principles are the same as that of the first embodiment, which are not described in detail.

While the present invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A fully differential level conversion circuit, comprising:
a positive signal branch;
a negative signal branch, the negative signal branch having identical structural features with the positive signal branch, both the positive signal branch and the negative signal branch of them comprising a drive terminal and a load terminal, and an external fully differential signal being inputted to the drive terminals of the positive signal branch and the negative signal branch correspondingly to proceed a level conversion so that their load terminals output a pseudo differential signal; and a coupling branch, the coupling branch comprising a first group of active couplers and a second group of active couplers, both of the first group of active couplers and the second group of active couplers connected between the positive signal branch and the negative signal branch, and further between the drive terminals and the load terminals, the first group of active couplers and the drive terminal of the positive signal branch forming a dual structure, and the second group of active couplers and the drive terminal of the negative signal branch forming another dual structure;
wherein the drive terminal of the positive signal branch comprises a first Field Effect Transistor which is a P-type Field Effect Transistor and a second Field Effect Transistor which is an N-type Field Effect Transistor, the external fully differential signal is inputted to gates of the first Field Effect Transistor and the second Field Effect Transistor that are jointly connected, drains of the first Field Effect Transistor and the second Field Effect Transistor are jointly connected to an output terminal of the positive signal branch, a source of the first Field Effect Transistor is connected with an external power source, and a source of the second Field Effect Transistor is grounded.

2. The fully differential level conversion circuit according to claim 1, wherein the first group of active couplers comprises a third Field Effect Transistor which is an N-type Field Effect Transistor and a fourth Field Effect Transistor which is a P-type Field Effect Transistor, drains of the third Field Effect Transistor and the fourth Field Effect Transistor are connected with the drain of the first Field Effect Transistor, gates of the third Field Effect Transistor and the fourth Field Effect Transistor are connected with the drain of the first Field Effect Transistor, a source of the third Field Effect Transistor is grounded, and a source of the fourth Field Effect Transistor is connected with the external power source; and the second group of active couplers comprises a fifth Field Effect Transistor which is an N-type Field Effect Transistor and a sixth Field Effect Transistor which is a P-type Field Effect Transistor, drains of the fifth Field Effect Transistor and the sixth Field Effect Transistor are connected with the drain of the first Field Effect Transistor, gates of the fifth Field Effect Transistor and the sixth Field Effect Transistor are connected with the drain of the first Field Effect Transistor, a source of the fifth Field Effect Transistor is grounded, and a source of the sixth Field Effect Transistor is connected with the external power source.

3. The fully differential level conversion circuit according to claim 2, wherein the load terminal comprises a seventh Field Effect Transistor which is a P-type Field Effect Transistor and an eighth Field Effect Transistor which is an N-type Field Effect Transistor, gates and drains of the seventh Field Effect Transistor and the eighth Field Effect Transistor are jointly connected to the drain of the first Field Effect Transistor, a source of the seventh Field Effect Transistor is connected with the external power source, a source of the eighth Field Effect Transistor is grounded, and the pseudo differential signal is outputted from the drains of the seventh Field Effect Transistor and the eighth Field Effect Transistor commonly.

4. The fully differential level conversion circuit according to claim 2, wherein the load terminal is a seventh Field Effect Transistor which is a P-type Field Effect Transistor, gate and drain of the seventh Field Effect Transistor are jointly connected to the drain of the first Field Effect Transistor, a source of the seventh Field Effect Transistor is connected with the external power source, and the pseudo differential signal is outputted from the drain of the seventh Field Effect Transistor.

5. The fully differential level conversion circuit according to claim 2, wherein the load terminal is an eighth Field Effect Transistor which is an N-type Field Effect Transistor, gate and drain of the eighth Field Effect Transistor are jointly connected to the drain of the first Field Effect Transistor, a source of the eighth Field Effect Transistor is grounded, and the pseudo differential signal is outputted from the drain of the eighth Field Effect Transistor.

* * * * *